US012772753B2

(12) United States Patent
Janz et al.

(10) Patent No.: US 12,772,753 B2
(45) Date of Patent: Oct. 20, 2026

(54) METHOD FOR PREPARING A GERMANIUM SUBSTRATE AND GERMANIUM SUBSTRATE STRUCTURE FOR EPITAXIAL GROWTH OF A GERMANIUM LAYER

(71) Applicant: Fraunhofer-Gesellschaft zur Förderung der angewandten Forschung e.V., Munich (DE)

(72) Inventors: Stefan Janz, Freiburg (DE); Waldemar Schreiber, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 440 days.

(21) Appl. No.: 18/554,725

(22) PCT Filed: Apr. 11, 2022

(86) PCT No.: PCT/EP2022/059591
§ 371 (c)(1),
(2) Date: Oct. 10, 2023

(87) PCT Pub. No.: WO2022/218905
PCT Pub. Date: Oct. 20, 2022

(65) Prior Publication Data

US 2024/0186141 A1 Jun. 6, 2024

(30) Foreign Application Priority Data

Apr. 12, 2021 (DE) ......................... 102021108992.1

(51) Int. Cl.
*H10P 14/00* (2026.01)
*H10F 77/1223* (2025.01)
(Continued)

(52) U.S. Cl.
CPC ......... *H10P 14/36* (2026.01); *H10F 77/1223* (2025.01); *H10P 14/2905* (2026.01); *H10P 14/3411* (2026.01); *H10P 50/613* (2026.01)

(58) Field of Classification Search
None
See application file for complete search history.

(56) References Cited

U.S. PATENT DOCUMENTS

2025/0336671 A1* 10/2025 Hanuš ................. H10P 14/2924

FOREIGN PATENT DOCUMENTS

DE 102009004560 8/2010

OTHER PUBLICATIONS

English translation of DE102009004560B3 (Year: 2009).*
(Continued)

*Primary Examiner* — Bradley Smith
(74) *Attorney, Agent, or Firm* — Volpe Koenig

(57) ABSTRACT

A method for preparing a germanium substrate for epitaxial growth of a germanium layer, having the steps of: A.) providing a germanium substrate having a processing side and a rear side opposite the processing side and electrochemical etching at least the processing side with at least the following etching steps: A.0) passivation of the processing side, which is polarized as a cathode, A.1) etching the processing side, the processing side being alternately polarized in an anode pulse as an anode and in a cathode pulse as a cathode, A.2) passivation of the processing side, the processing side being polarized as a cathode; A.3) etching the processing side, the processing side being alternately polarized in an anode pulse as an anode and in a cathode pulse as a cathode; B.) reorganizing the processing side, the germanium substrate being heated to greater than 500° C. A germanium substrate structure is also provided.

23 Claims, 3 Drawing Sheets

(51) Int. Cl.
*H10P 14/20* (2026.01)
*H10P 50/61* (2026.01)

(56) References Cited

OTHER PUBLICATIONS

A. Boucherif, et al, "Mesoporous Germanium Morphology Transformation for Lift-off Process and Substrate Re-Use" DOI 10.1063/1.4775357, Applied Physics Letters, vol. 102, Jan. 11, 2013, article No. 011915, pp. 1-5, XP012168696.

Bioud, Y. [et al.]: Mesoporous germanium by high frequency bipolar electrochemical etching for optical sensor applications. In Proceedings of Porous Semiconductors—Science and Technology (PSST) Conference, hal-01565497, 2016.

Garralaga Rojas, E.J.: Mesoporous Germanium Layer Formation by Electrochemical Etching. Dissertation Christian-Albrechts-Universitat zu Kiel, 2010.

Arvinte Roxana et al. "Epitaxial lift-off process for III-V solar cells by using porous germanium for substrate re-use", 2020 47th IEEE Photovoltaic Specialists Conference (PVSC), IEEE, Jun. 15, 2020 (Jun. 15, 2020), pp. 1976-1981, DOI: 10.1109/PVSC45281.2020.9301028 XP033870238.

* cited by examiner

METHOD FOR PREPARING A GERMANIUM SUBSTRATE AND GERMANIUM SUBSTRATE STRUCTURE FOR EPITAXIAL GROWTH OF A GERMANIUM LAYER

CROSS-REFERENCE TO RELATED APPLICATIONS

This application is a 371 National Phase of PCT/EP2022/059591, filed Apr. 11, 2022, which claims priority to German Patent Application No. 10 2021 108 992.1, filed Apr. 12, 2021, both of which are incorporated herein by reference as if fully set forth.

TECHNICAL FIELD

The invention relates to a method for preparing a germanium substrate for epitaxial growth of a germanium layer and to a germanium substrate structure.

BACKGROUND

Germanium layers are often used in the production of semiconductor components, in particular in the production of photovoltaic solar cells. Producing the germanium layer on a germanium substrate by means of epitaxy is a standard procedure. It is advantageous in this case to arrange a porous layer structure between the non-porous germanium substrate and the epitaxially applied germanium layer in order to form functioning semiconductor components in the germanium layer independently of the germanium substrate, in particular in order to detach the germanium layer from the germanium substrate.

A. Boucherif, et al, "Mesoporous Germanium Morphology Transformation for Lift-off Process and Substrate Re-Use" DOI 10.1063/1.4775357 discloses the formation of a porous structure on a processing side of a germanium substrate, the epitaxial growth of a germanium layer on the processing side, the detachment of the germanium layer and the reuse of the remaining germanium substrate.

Investigations by the applicant show that the previously known processes have disadvantages in terms of the process reliability and/or the quality of the produced germanium layer, in particular deficiencies in the electronic quality of the produced germanium layer and/or a high risk of breakage when detaching the germanium layer.

There is therefore a need to produce germanium layers epitaxially on a germanium substrate with high electronic quality and high process reliability, in particular with a low risk of breakage when being detached.

SUMMARY

The present invention is therefore based on the object of providing an improved germanium substrate structure for epitaxial growth of a germanium layer and a method for the production thereof.

This object is achieved by a method for preparing a germanium substrate for epitaxial growth of a germanium layer and a germanium substrate structure for epitaxial growth of a germanium layer having one or more of the features described herein. Advantageous configurations can be found in the description and claims that follow.

The germanium substrate structure according to the invention is preferably produced by means of the method according to the invention, in particular a preferred embodiment thereof. The method according to the invention is preferably configured to produce the germanium substrate structure according to the invention, in particular a preferred embodiment thereof.

The method according to the invention for preparing a germanium substrate for epitaxial growth of a germanium layer has the following method steps:

- A. provision of a germanium substrate having a processing side and a rear side on the opposite side to the processing side and electrochemical processing at least of the processing side of the germanium substrate with at least the following processing steps:
  - A.0 passivation of the processing side, the processing side being polarized as a cathode,
  - A.1 etching of the processing side, the processing side being alternately polarized in an anode pulse as an anode and in a cathode pulse as a cathode;
  - A.2 electrochemical passivation of the processing side of the germanium substrate, the processing side being polarized as a cathode;
  - A.3 etching of the processing side, the processing side being alternately polarized in an anode pulse as an anode and in a cathode pulse as a cathode;
- B. reorganization of the processing side, the germanium substrate being heated to a temperature of greater than 500° C.

The method steps are carried out in the order listed above, it being within the scope of the invention to add further intermediate steps.

Electrochemical method steps which do not involve a change in the polarity during the processing are referred to as unipolar method steps. The above-described method step A.2 and method step A.0 are preferably designed as unipolar method steps.

Method steps with a change in the polarity are referred to as bipolar method steps. Preferably, the above-described method steps A.1 and A.3, further preferably at least one of the method steps A.1A and A.4 described below in advantageous embodiments, preferably both method steps, are designed as bipolar method steps.

The method according to the invention thus has multiple processing steps which are designed as electrochemical processing steps. In this case the processing side is processed, with etching being carried out (in particular in the method steps A.1 and A.3) by means of electrochemically triggered removal of germanium atoms, or electrochemical passivation being carried out (in particular in method step A.0 and A.2) in particular by means of termination of the free germanium bonds on the surface. This also applies to the method steps which are mentioned below as advantageous developments and which relate to etching or passivation. A feature common to the method steps for etching or passivation of the processing side is that an electric field is necessary for the processing procedure.

In a method step A.0, before method step A.1, a processing side of the germanium substrate is passivated, the processing side being polarized as a cathode. This results in the advantage that the surface atoms, at locations where this is possible, are also passivated, in particular with one or more elements from the etching solution, in particular with hydrogen.

By combining electrochemical etching processes performed in a bipolar manner with unipolar passivation processes, the formation of the porous individual layers can be separated from one another significantly better. This forms layer stacks where the individual layers differ greatly from one another in terms of their porosity. In the reorganization there is then a structural rearrangement which leads to an increase in these porosity differences.

In an advantageous embodiment, a dendritic layer, preferably having a porosity in the range from 5% to 15% and a thickness in the range from 200 nm to 1.5 μm, is produced on the processing side by means of method step A.1.

The dendritic structure offers the advantage that adjacent dendrites are sufficiently far apart such that they can be effectively passivated when A.2 is carried out. This also means that the substrate surface is changed only slightly, if at all, during method step A.3.

In a further advantageous embodiment, in method step A.1 the pulse duration of the anode pulse essentially, in particular exactly, corresponds to the length of the cathode pulse.

This ensures that the propagation of already formed dendrites is not prematurely interrupted and that etching occurs orthogonally to the substrate surface.

In a further advantageous embodiment, a layer having a thickness in the range from 0.5 μm to 2 μm, in particular in the range from 1.4 μm to 1.6 μm, and a porosity in the range from 5% to 15% is produced by means of method step A.1A.

As a result, the already existing layer remains largely unchanged and yet the thickness of the porous layer is increased. In addition, the porosity of the newly formed porous region is slightly reduced with respect to the already existing porous layer.

In a further advantageous embodiment, method step A.1 is carried out for a period of greater than 15 minutes, in particular for a period in the range from 15 minutes to 2 hours, preferably in the range from 15 minutes to 30 minutes.

As a result, the thickness of the closed growth template layer described further below is also determined. Investigations show that the aforementioned process parameters enable a high-quality closed growth template layer.

In a further advantageous embodiment, in method step A.1 the etching current density is in the range from 0.2 $mA/cm^2$ to 1 $mA/cm^2$, in particular in the range from 0.25 $mA/cm^2$ to 0.75 $mA/cm^2$.

This ensures that, on the one hand, the density of the etching points does not disadvantageously change the roughness of the surface, and, on the other hand, it is intended thereby to ensure that the formed dendrites do not come too close together.

In a further advantageous embodiment, method step A.2 is carried out for a period in the range from 5 minutes to 20 minutes, in particular in the range from 4 minutes to 12 minutes.

This achieves uniform passivation. In an advantageous refinement, the free germanium bonds on the surface are passivated by hydrogen, especially preferably by using hydrofluoric acid (HF) and/or water for the passivation.

In a further advantageous embodiment, in method step A.2 the current density is in the range from 0.5 $mA/cm^2$ to 1.5 $mA/cm^2$, in particular about 1 $mA/cm^2$.

This avoids or at least reduces local development of molecular hydrogen particularly at the beginning of the process and promotes uniform hydrogen passivation of hydroxide-passivated germanium surface atoms.

In a further advantageous embodiment, method step A.3 is carried out for a period in the range from 3 minutes to 1 hour, in particular in the range from 5 minutes to 45 minutes.

As a result, a buffer layer forms at the transition to the solid body in accordance with the shape and the properties of the porous structures situated thereabove.

In a further advantageous embodiment, in method step A.3 the etching current density is in the range from 2 $mA/cm^2$ to 15 $mA/cm^2$, in particular in the range from 2.5 $mA/cm^2$ to 5 $mA/cm^2$. The duration of an anode pulse is advantageously in the range from 0.5 s to 1 s.

This increases the porosity of the layer formed. Furthermore, this promotes a situation in which the already existing porous layers are not changed (attacked).

Advantageously, in method step A.3 the duration of the anode pulse is shorter than the duration of the cathode pulse. This results in the advantage that destruction, particularly of the regions important for epitaxy, is minimized.

In a further advantageous embodiment, in method step B heating is effected to a temperature in the range from 600° C. to 800° C.

In this process step, the thermal energy is provided which leads to diffusion of the free germanium bonds along the surfaces or in the volume, resulting in a rearrangement of the porous structures.

Preferably, in method step B heating is effected for a period of greater than or equal to 15 minutes, in particular in the range from 15 minutes to 1.5 h.

This achieves a rearrangement that leads to structures which are in energetic equilibrium and for example reproduce the crystal planes in the pores (for example pore walls in the <111> orientation).

Preferably, method step B is carried out in a hydrogen atmosphere and/or argon atmosphere.

Hydrogen and/or argon lead to removal of the surface oxide and thereby lead to free germanium bonds which in turn can diffuse and therefore rearrange themselves.

In a further advantageous embodiment, the pulse duration in method step A.1 and/or A.3, preferably A.1 and A.3, is in each case less than 10 seconds, preferably less than 5 seconds, particularly preferably less than 2 seconds, in particular less than 1 second. For the specified method steps, the pulse duration of each anode pulse and each cathode pulse is thus preferably in each case less than the specified upper limit. This results in the advantage that a time-efficient method is achieved.

In order to achieve a sufficient passivation effect, is it advantageous that method step A.0 and/or method step A.2, preferably method step A.0 and method step A.2, is carried out for a period of greater than 10 seconds, in particular greater than 15 seconds, preferably greater than 20 seconds, in particular that method step A.0 is carried out for a period in the range from 10 seconds to 30 seconds, in particular in the range from 15 seconds to 25 seconds.

In particular, it is advantageous that the cathode pulse duration in passivation step A.0 is greater than the cathode pulse duration in method step A.1, preferably that the cathode pulse duration in passivation step A.0 is greater than the cathode pulse duration in method step A.1 by at least a factor of 1.5, preferably by at least a factor of 2, in particular by at least a factor of 5. This achieves good passivation in method step A.0 on the one hand and good porosification in method step A.1 on the other hand.

Furthermore, it is advantageous that the cathode pulse duration in passivation step A.2 is greater than the cathode pulse duration in method step A.3, preferably that the cathode pulse duration in passivation step A.2 is greater than the cathode pulse duration in method step A.3 by at least a factor of 1.5, preferably by at least a factor of 2, in particular by at least a factor of 5. This achieves good passivation in method step A.2 on the one hand and good porosification in method step A.3 on the other hand.

In a further advantageous embodiment, method step A.0 method step A.0 and/or method step A.2, preferably method step A.0 and method step A.2, is carried out for a period of greater than 10 seconds, in particular greater than 15 seconds, preferably greater than 20 seconds, in particular that method step A.0 is carried out for a period in the range from 10 seconds to 30 seconds, in particular in the range from 15 seconds to 25 seconds.

This achieves uniform passivation. In an advantageous refinement, the free germanium bonds on the surface are passivated by hydrogen, especially preferably by using hydrofluoric acid (HF) and/or water for passivation.

Advantageously, in a method step A.1A, between method step A.1 and A.2, the processing side is etched with an etching current density that is higher than method step A.1, the processing side being alternately polarized in an anode pulse as an anode and in a cathode pulse as a cathode and the anode pulse duration being shorter than the cathode pulse duration.

This results in the advantage that, on the one hand, the already existing porous layer is protected against an etching attack and, on the other hand, an additional layer of lower porosity is formed. This is important in order to create, in the reorganization in process step B, a region that does not act as a diffusion sink.

In a further advantageous embodiment, in method step A.1A the pulse duration of the anode pulse is in the range from 30% to 70%, preferably in the range from 40% to 60%, in particular about 50%, of the pulse duration of the cathode pulse.

This promotes a situation in which there is no formation of regions which are uncontrollably etched. A longer passivation pulse ensures that the number of surface atoms formed by the etching pulse is less than the maximum number of surface atoms that can be passivated during the passivation pulse.

In a further advantageous embodiment, method step A.1A is carried out for a period of greater than 45 minutes, in particular for a period in the range from 45 minutes to 2 hours, preferably in the range from 1 hour to 1.5 hours.

As a result, the already existing layer remains largely unchanged and yet the thickness of the porous layer is increased.

In a further advantageous embodiment, in method step A.1A the etching current density is greater than the etching current density in method step A.1 by at least 10%, preferably by at least 20%, in particular by at least 35%.

The increased current density leads to a greater field line density, with the result that the porous layer is formed preferably orthogonally to the substrate surface.

Advantageously, a further etching step A.4 is performed after method step A.3, the processing side being alternately polarized in an anode pulse as an anode and in a cathode pulse as a cathode. This results in the advantage that if there is any resulting limitation of the highly porous separating layer by {111} planes in the direction of the solid body, the diffusion of atoms that takes place laterally to the surface may be hindered and this has a disadvantageous effect on the formation of the separating layer. An additional layer of lower porosity below the highly porous layer enables the diffusion of atoms from the highly porous layer during the reorganization in method step B and thus promotes the formation of a separating layer.

Etching step A.4 preferably has an etching current density that is lower than etching step A.3, preferably a current density lower than in method step A.3 by at least 30%, further preferably at least 50%. This results in the advantage that a layer of lower porosity is created which serves as a diffusion sink.

Advantageously, method step A.4 has an asymmetric ratio of cathode pulse duration and anode pulse duration, in particular a ratio in the range from 1.5:1 to 2.5:1 (cathode pulse duration to anode pulse duration), in particular of 2:1. This results in the advantage that the already existing porous layers are still not influenced by the etching process.

The method according to the invention is particularly suitable for producing, on the germanium substrate on the processing side, a semiconductor component layer structure which comprises at least one layer of germanium preferably deposited epitaxially, in particular deposited by means of vapor phase epitaxy. On account of the preparation of the processing side, the germanium layer has a high electronic quality and is particularly suitable for forming one or more semiconductor components, in particular for forming one or more photovoltaic solar cells.

It is within the scope of the invention for the semiconductor component(s) to be formed while the semiconductor component layer structure is arranged on the germanium substrate. It is also within the scope of the invention for the semiconductor component layer structure to first be detached from the germanium substrate and then the semiconductor component(s) to be formed, in particular with formation of additional layers on the semiconductor component layer structure. It is also within the scope of the invention for the semiconductor component(s) to be formed partially before detachment and partially after detachment of the semiconductor component layer structure.

It is therefore advantageous that a semiconductor component layer structure is applied directly or indirectly to the processing side of the germanium substrate, the semiconductor component layer structure having at least a first layer of germanium or of compound semiconductors comprising elements of main groups 3 and 5 of the Periodic Table which is preferably applied by means of epitaxy, in particular by means of vapor phase epitaxy.

The first layer of germanium or of compound semiconductors comprising elements of the third and fifth main groups of the Periodic Table is preferably arranged on the processing side of the germanium substrate, especially preferably directly on the processing side of the germanium substrate.

It is within the scope of the invention for the semiconductor component layer structure to have multiple layers, in particular 2 to 6 layers. Such a semiconductor component layer structure is advantageous in particular for the formation of electro-optical components, in particular photovoltaic solar cells.

In an advantageous embodiment, the first layer of the semiconductor component layer structure therefore consists of germanium and has a thickness of preferably 1 μm to 10 μm and the semiconductor component layer structure has multiple, preferably 2 to 6, layers of compound semiconductors.

A thickness of the entire semiconductor component layer structure in the range from 5 μm to 40 μm is advantageous for such a semiconductor component layer structure.

In a further advantageous configuration, the first layer of the semiconductor component layer structure consists of germanium and has a thickness of 10 to 150 μm, preferably 50 μm to 150 μm. Such a germanium layer is particularly suitable for forming photovoltaic solar cells.

The semiconductor component layer structure is preferably separated from the germanium substrate as described above.

It is therefore advantageous that the semiconductor component layer structure is separated from the germanium substrate, in particular the edges of the semiconductor component layer structure are removed, preferably by lasering or sawing, before the semiconductor component layer structure is separated from the germanium substrate. Removing the edges of the semiconductor component layer structure has the advantage of reducing the risk that the semiconductor component layer structure is damaged, in particular breaks, during removal.

As described above, the method according to the invention has the advantage that the germanium substrate can be used to produce multiple germanium layers, in particular multiple semiconductor component layer structures.

It is therefore advantageous that the germanium substrate is used multiple times, wherein, after removing the semiconductor component layer structure as a first semiconductor component layer structure, at least a second semiconductor component layer structure as described above is applied to the germanium substrate and then separated from the germanium substrate.

In particular it is advantageous that, after separating the first semiconductor component layer structure from the germanium substrate and before applying the second semiconductor component layer structure, the processing side of the germanium substrate is aftertreated, preferably mechanically and/or chemically smoothed. The aftertreatment increases the quality of the layers subsequently produced on the germanium substrate.

The object stated at the outset is also achieved by a germanium substrate structure achieved. having a germanium substrate and having a germanium layer epitaxially grown on the germanium substrate.

The germanium substrate structure according to the invention has a germanium substrate which is produced by the method, in particular a preferred embodiment thereof. A germanium layer is arranged on the germanium substrate of the germanium substrate structure. The germanium substrate has a front side, referred to as the processing side, on which the germanium layer is arranged, and a rear side on the opposite side to the front side.

The germanium layer has p-type or n-type doping with a doping concentration of greater than $10^{15}$ $cm^{-3}$. The germanium substrate has at least one porous layer having a thickness in the range from 0.1 to 1.5 μm and a porosity of greater than 40% which is arranged on the processing side of the germanium substrate and has a growth layer terminating the germanium substrate at the processing side and having a thickness in the range from 1 μm to 2 μm and a porosity of less than 5%. The germanium layer has an irregular, pyramid-shaped structure on the surface facing the porous layer. This results in the above-mentioned advantages.

As described above, method step A has a plurality of processing steps, in particular etching steps and/or passivation steps, that are designed as electrochemical processing steps. In this case, the processing side of the germanium substrate is preferably brought into contact with a first etching solution. The first etching solution is preferably electrically contacted by means of a first electrode. Electrochemical etching of a germanium substrate per se is already known and described, for example, in "Mesoporous Germanium Formation by Electrochemical Etching" DOI: 10.1149/1.3147271.

During an anode pulse, the surface to be processed serves as an anode and therefore accepts electrons from the ions of the electrolyte. During a passivation pulse, the surface to be processed serves as a cathode and donates electrons to the ions of the electrolyte.

The rear side of the germanium substrate is preferably contacted by bringing the rear side into contact with a second etching solution, the second etching solution being contacted by means of a second electrode.

It is also within the scope of the invention to contact the contacting of the rear side of the germanium substrate directly with an electrically conductive and solid medium (what is known as dry contact).

A voltage source is used to generate a potential between the first and second electrode, with the result that an etching current flows.

The first and the second etching liquid are preferably physically separated from one another. In particular, it is advantageous that the first and second etching liquid are arranged in two basins and the germanium substrate forms a partition between the two basins.

The first and second etching liquid are preferably of the same design.

Advantageously, all etching steps/passivation steps in method step A are carried out with the same etching liquids. This results in a cost-saving process.

The first and/or the second etching liquid preferably comprise(s) one or more acids, preferably hydrofluoric acid.

Preferably, the first and/or the second etching liquid comprises a wetting agent, in particular ethanol, isopropanol, acetic acid or formic acid.

Preferably, the first and/or the second etching liquid comprise(s) water.

In an advantageous embodiment, the electrochemical etching process is performed in an installation consisting of an etching basin which is contacted on both sides by electrodes. The etching basin contains an etching solution consisting of hydrofluoric acid, a wetting agent and water. The wafer to be etched is arranged in the basin such that it divides the basin into two regions that are electrically separated from one another. The etching/passivation currents are generated in a generator and are brought to the two electrodes via electrical lines.

A closed growth template layer is preferably formed on the processing side by way of the reorganization in method step B. Said layer has an essentially closed surface and thus promotes defect-free epitaxial growth of a semiconductor layer, particularly a germanium layer, on the growth template layer. The closed growth template layer is preferably formed with a thickness in the range from 1 nm to 100 nm, in particular with a thickness in the range from 5 nm to 30 nm.

BRIEF DESCRIPTION OF THE DRAWINGS

Further advantageous features and embodiments are explained below on the basis of exemplary embodiments and FIGS. 1A-1C, 2A-2C and 3 which show a series of schematic cross-sections through a germanium substrate for epitaxial growth of a germanium layer to illustrate the method.

DETAILED DESCRIPTION

The figures show schematic illustrations, not true to scale, of substeps of an exemplary embodiment of a method according to the invention for preparing a germanium substrate for epitaxial growth of a germanium layer.

A germanium substrate is first provided. In the present exemplary embodiment, the germanium substrate has a thickness of 170 μm and p-type doping with the dopant Ga and a doping concentration of (1 to 2)$\times10^{18}$ $cm^{-3}$, in the present case $1.5\times10^{18}$ $cm^{-3}$.

Figure 1A:
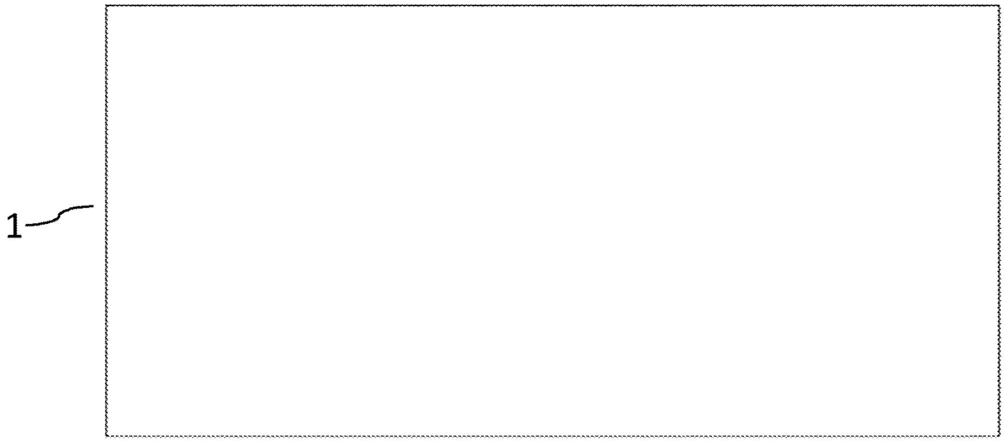

The germanium substrate is cleaned at least on the processing side (front side), at the top in the figures, of the germanium substrate, in the present case by means of hydrofluoric acid at a concentration of one percent by weight for a period of 3 minutes. FIG. 1A) schematically shows the germanium substrate 1.

Subsequently, in a method step A, the processing side of the germanium substrate is electrochemically processed.

In the present example, the electrochemical etching process is performed in an installation consisting of an etching basin which is contacted on both sides by electrodes. The etching basin contains an etching solution consisting of hydrofluoric acid, a wetting agent and water. The wafer to be etched is installed in the basin such that it divides the basin into two regions that are electrically separated from one another. The etching/passivation currents are generated in a generator and are brought to the two electrodes via electrical lines.

The etching liquids mentioned and the described method of electrochemical processing is used for all etching steps described below, in particular also for the passivation steps.

The method step A has multiple substeps:

In a method step A.0, the processing side of the germanium substrate is passivated, the processing side being polarized as a cathode. The passivation is effected for a period of 20 seconds. The current intensity is specified here and below by a current density which is specified per square centimeter of the surface of the processing side of the germanium substrate. A current intensity j of 1 $mA/cm^2$ is used in method step A.0 of the present first exemplary embodiment.

In a method step A.1, the processing side is etched, the processing side being alternately polarized with an anode pulse as an anode and a cathode pulse as a cathode.

The etching is effected for a total period of 30 minutes at a current density j of 0.75 $mA/cm^2$. The current direction with the aforementioned current intensity is alternately changed, each pulse having a duration of 1 second and then the current direction immediately being changed, so that polarization with alternating anode pulses and cathode pulses each having a pulse duration of 1 second is carried out alternately for 30 minutes.

Figure 1B:
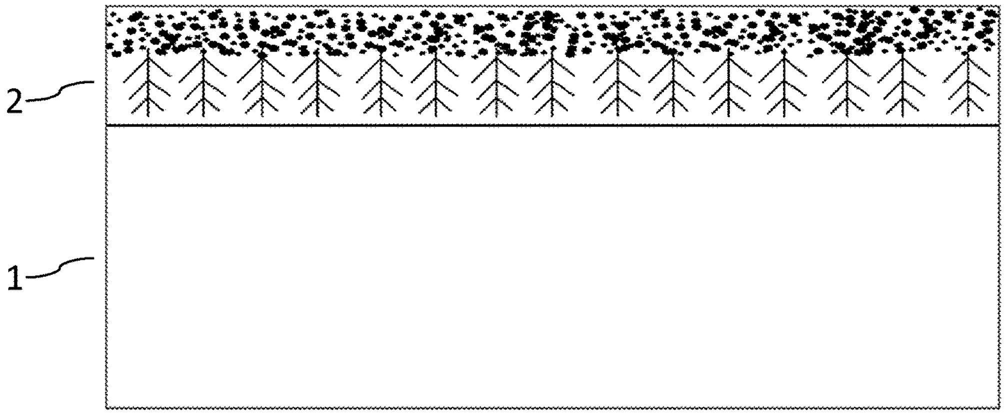

The result of method steps A.0 and A.1 is shown schematically in FIG. 1B): A regionally dendritic layer 2, in the present case having a porosity in the range from 1% to 20%, in the present case about 10%, and a thickness of 100 nm to 1000 nm, in the present case 500 nm, is formed on the surface of the germanium substrate 1 by way of method step A.1. The layer 2 has a sponge-like structure in a region near the surface and a dendritic structure in a region facing the rear side, which is illustrated schematically in the figures by branch structures.

Figure 1C:
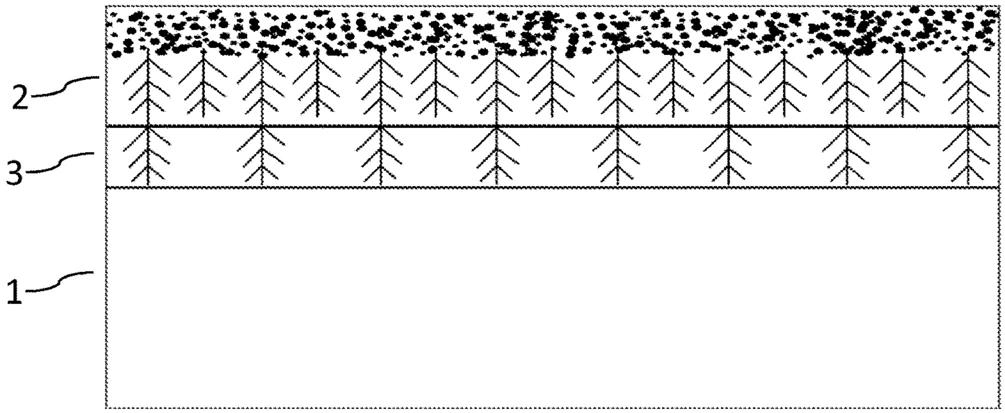

In a method step A.1A, the processing side is etched with an etching current density that is higher than method step A.1, the processing side being alternately polarized with an anode pulse as an anode and a cathode pulse as a cathode. This method step is carried out for a period of 60 minutes, at a current intensity of 1 $mA/cm^2$. The present exemplary embodiment involves an alternation with different pulse durations, with the anode pulse and cathode pulse alternately changing, each anode pulse having a pulse duration of 0.5 seconds and each cathode pulse having a pulse duration of 1 second. The situation after method step A.1A is illustrated schematically in FIG. 1C:

While the layer 2 produced in method step A.1 exhibits a sponge-like, porous configuration in a region facing the processing side, lying at the top, of the germanium substrate 1, branch-like porous structures (dendritic region) of the layer 2 extend in the direction of the rear side of the germanium substrate 1 starting from the sponge-like layer.

A porous layer 3 with thinned-out branches is produced in method step A.1A. In the present case, this porous layer 3 has a thickness of 500 nm and a porosity in the range from 1% to 10%, in the present case 2%. In comparison with the dendritic layer 2, the porous layer 3 with thinned-out branches has a lower number of branch-like recesses.

In a method step A.2 the processing side of the germanium substrate 1 is passivated, the processing side being polarized as a cathode. Method step A.2 is carried out for a period of 10 minutes at a current intensity of 1 $mA/cm^2$.

Figure 2A:
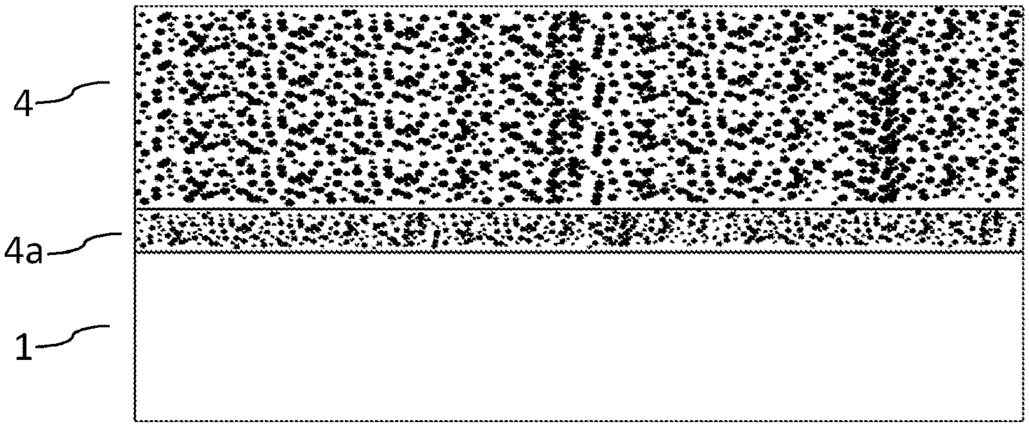

In a method step A.3, the processing side is etched, the processing side being alternately polarized with an anode pulse as an anode and a cathode pulse as a cathode. In the present case, the treatment in method step A.3 is effected for a period of 45 minutes, with the current density of each anode pulse and cathode pulse being 4 $mA/cm^2$, the pulse duration of each anode pulse being 1 second and the pulse duration of each cathode pulse being 1 second. This results in a conversion of the branch structures into sponge-like, porous structures, with the result that a porous, sponge-like layer 4 is formed from the dendritic layer 2 and the porous layer with thinned-out branches 3 and additionally extends further in the direction of the rear side of the germanium substrate 1 by a porous sponge-like layer 4*a*. This is illustrated schematically in FIG. 2A).

An etching step A.1A is effected once again in a further method step A.4: in method step A.4 the processing side is alternately polarized in an anode pulse as an anode and a cathode pulse as a cathode for a period of 10 minutes, the current density for the anode pulse and for the cathode pulse in each case being 2 $mA/cm^2$. The duration of the anode pulse is 0.5 seconds and of the cathode pulse is 1 second.

Figure 2B:
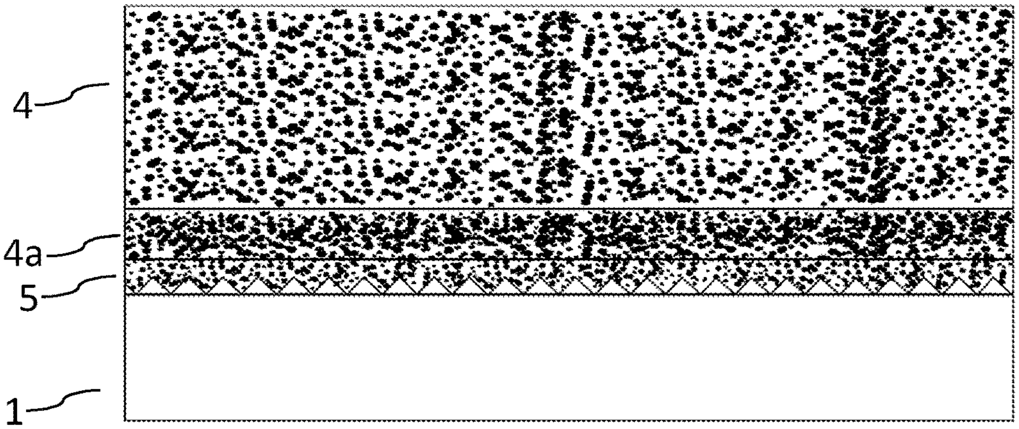
Figure 2C:
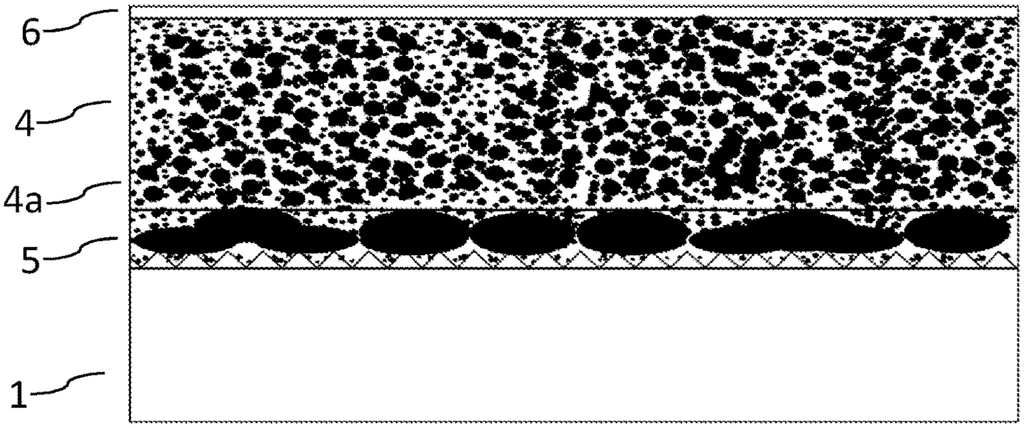

This produces a thin porous layer 5 (in the present case having a thickness of 300 nm) with facets, which can promote the detachment process described further below. The facets form an irregular, pyramid-shaped structure on the surface of the germanium substrate facing the porous layer. This is illustrated schematically in FIG. 2B).

In addition, the porosity of the layer 4*a* is increased.

The germanium substrate 1 is then cleaned for 3 minutes on the processing side by means of hydrofluoric acid at a concentration of one percent by weight.

Finally, the germanium substrate 1 is dried in ethanol.

Reorganization of the processing side is effected in a method step B, the germanium substrate being heated to a temperature of greater than 500° C.; in the present case, the temperature is increased linearly with an increase of 100° C. per minute to 800° C. and then held at the temperature of 800° C. for 30 minutes.

This forms a closed growth template layer 6 on the front side. In the present case, said layer has a thickness in the range from 100 nm to 1 μm, in the present case of 100 nm.

In addition, the porosity increases both in the layers 4, 4*a* and, with the thicknesses of the layers decreasing slightly and the cavities of the layers increasing.

It is now possible to place on the closed growth template layer 6 a germanium layer for the production of a semiconductor component, in particular a photovoltaic solar cell.

The germanium layer is applied in the present case by means of vapor phase epitaxy and has a thickness of 10 μm and a p-type doping of $5\times10^{17}$ atoms/$cm^3$. This is illustrated schematically in FIG. 3.

Figure 3:
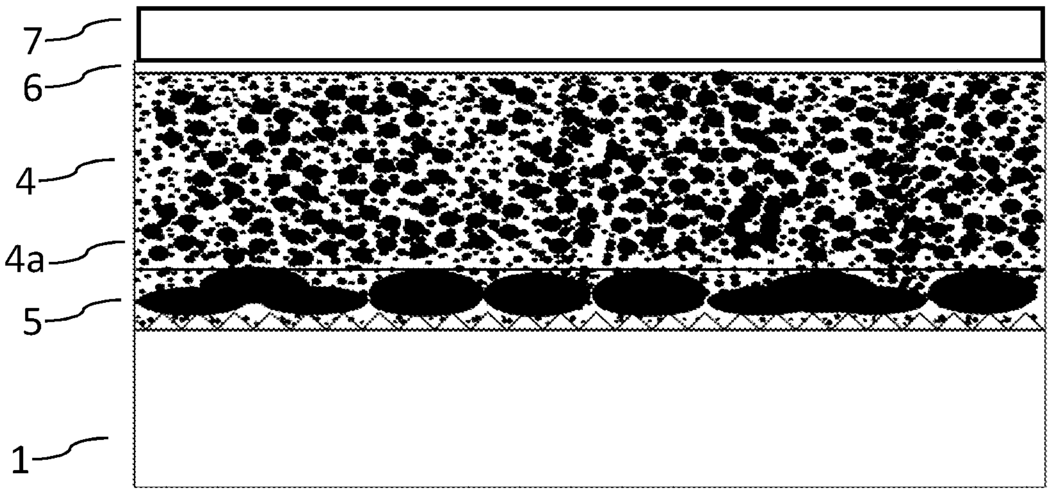

The illustration in FIG. 3 thus shows an exemplary embodiment of a germanium substrate structure according to the invention. Located at the transition between the porous region and the solid semiconductor are pyramid-shaped structures which appear in the present cross-sectional image as facets ("sawtooth").

The germanium layer 7 is detached from the germanium substrate 1; the germanium substrate 1 can be reused by carrying out the method again in order to epitaxially deposit another germanium layer and then detach it. The area to be detached can be defined by means of sawing or lasering before the germanium layer 7 is detached. The detachment procedure itself can be effected by application of suction or adhesive action to the layer 7 to be detached and subsequent mechanical lifting-off.

The table below summarizes the essential method parameters of the individual method steps once again and additionally also lists method parameters of a second exemplary embodiment of a method according to the invention. The current density is denoted here by j, with a corresponding sign (+/−) indicating the current direction. The current densities are always given as positive values, and the current direction results from the sign of the variable j. The pulse durations of the anode pulses are indicated in each case by $t_+$ of the cathode pulses by $t_-$. The total duration of the method step is indicated by $t_{tot}$.

| Method step | Exemplary embodiment 1 | Exemplary embodiment 2 |
|---|---|---|
| Cleaning | HF, 3 min, 1 wt % | HF, 3 min, 1 wt % |
| A.0 | $j_- = 1$ mA/$cm^2$<br>$t_{tot} = 20$ s | — |
| A.1 | $t_+ = t_- = 1$ s<br>$j_+ = j_- = 0.75$ mA/$cm^2$<br>$t_{tot} = 30$ min | $t_+ = t_- = 1$ s<br>$j_+ = j_- = 0.75$ mA/$cm^2$<br>$t_{tot} = 60$ min |
| A.1A | $t_+ = 0.5$ s<br>$t_- = 1$ s<br>$j_+ = j_- = 1$ mA/$cm^2$<br>$t_{tot} = 60$ min | — |
| A.2 | $j_- = 1$ mA/$cm^2$<br>$t_{tot} = 10$ min | $j_- = 1$ mA/$cm^2$<br>$t_{tot} = 10$ min |
| A.3 | $t_+ = 1$ s<br>$t_- = 1$ s<br>$j_+ = j_- = 4$ mA/$cm^2$<br>$t_{tot} = 45$ min | $t_+ = 0.8$ s<br>$t_- = 1$ s<br>$j_+ = j_- = 5$ mA/$cm^2$<br>$t_{tot} = 30$ min |
| A.4 | $t_+ = 0.5$ s<br>$t_- = 1$ s<br>$j_+ = j_- = 2$ mA/$cm^2$<br>$t_{tot} = 10$ min | — |
| Cleaning | HF, 3 min, 1 wt % | HF, 3 min, 1 wt % |
| Drying | by means of ethanol | by means of ethanol |
| B | Temperature increase with 100° C./min to 800° C.; 30 min at 800° C. | Temperature increase with 100° C./min to 800° C.; 30 min at 800° C. |

Exemplary embodiment 2 is a substantially simplified embodiment in comparison with example 1. It differs from example 1 in that there is no initial passivation of the wafer surface (method step A.0) before the first etching step, which can lead to lower homogeneity of the etching attack. In example 2 there is no further etching step with adapted etching parameters after the first etching step, which can lead to absence of a thinned-out layer region at the interface to the solid wafer (see layer 3 in FIG. 1C). The final electrochemical etching step is also missing in example 2, which can lead to a less pronounced highly porous layer at the boundary to the solid wafer and to a less pronounced faceting at this interface.

LIST OF REFERENCE SIGNS

1 germanium substrate
2 dendritic layer
3 porous layer with thinned-out branches
4, 4*a* porous, sponge-like layer
6 closed growth template layer
7 epitaxially applied germanium layer

The invention claimed is:

1. A method for preparing a germanium substrate (1) for epitaxial growth of a germanium layer (7), comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C.; and carrying out method step A.2 for a period in the range from 5 minutes to 20 minutes.

2. The method as claimed in claim 1, further comprising producing a dendritic layer (2) on the processing side by method step A.1.

3. The method as claimed in claim 1, wherein in method step A.1 a pulse duration of the anode pulse is equal to a pulse duration of the cathode pulse.

4. The method as claimed in claim 1, further comprising carrying out method step A. 1 for a period of greater than 15 minutes.

5. The method as claimed in claim 1, wherein in method step A.1 an etching current density is in a range from 0.1 mA/$cm^2$ to 1 mA/$cm^2$.

6. The method as claimed in claim 1, further comprising carrying out method step A.3 for a period in a range from 3 minutes to 1 hour.

7. The method as claimed in claim 1, wherein in method step B at least one of i) heating is effected to a temperature in a range from 600° C. to 800° C., ii) the heating is effected for a period of greater than or equal to 15 minutes, or iii) method step B is carried out in a hydrogen atmosphere or argon atmosphere.

8. The method as claimed in claim 1, wherein a pulse duration in at least one of method step A.1 or method step A.3 is in each case less than 10 seconds.

9. The method as claimed in claim 1, wherein at least one of method step A.0 or method step A.2 is carried out for a period of greater than 10 seconds.

10. The method as claimed in claim 1, further comprising applying a semiconductor component layer structure directly or indirectly to the processing side of the germanium substrate (1), the semiconductor component layer structure having at least a first layer of germanium or of compound semiconductors comprising elements of main groups 3 and 5 of the Periodic Table.

11. The method as claimed in claim 10, wherein (i) the first layer of the semiconductor component layer structure consists of germanium and the semiconductor component layer structure has multiple layers of compound semiconductors, or (ii) the first layer of the semiconductor component layer structure consists of germanium and has a thickness of 10 to 150 μm.

12. The method as claimed in claim 10, wherein the semiconductor component layer structure is separated from the germanium substrate (1).

13. The method as claimed in claim 10, wherein the germanium substrate (1) is used multiple times, and, after removing the semiconductor component layer structure as a first semiconductor component layer structure, at least a second semiconductor component layer structure is applied to the germanium substrate (1) and then separated from the germanium substrate (1).

14. A method for preparing a germanium substrate (1) for epitaxial growth of a germanium layer (7), comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C.;

wherein in method step A.2 a current density is in a range from 0.5 mA/cm$^2$ to 2 mA/cm$^2$.

15. A method for preparing a germanium substrate (1) for epitaxial growth of a germanium layer (7), comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C. U;

wherein in method step A.3 an etching current density is in a range from 2 mA/cm$^2$ to 15 mA/cm$^2$, and a duration of the anode pulse is in a range from 0.5 s to 2.5 s.

16. A method for preparing a germanium substrate (1) for epitaxial growth of a germanium layer (7), comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C.;

wherein in method step A.3 a duration of the anode pulse is shorter than a duration of the cathode pulse.

17. A method for preparing a germanium substrate (1) for epitaxial growth of a germanium layer (7), comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C.; and in a method step A.1A, between method step A.1 and A.2, etching the processing side with an etching current density that is higher than method step A.1, the processing side being alternately polarized in an anode pulse as an anode and in a cathode pulse as a cathode, and an anode pulse duration is shorter than a cathode pulse duration.

18. The method as claimed in claim 17, wherein a layer having a thickness in a range from 0.5 μm to 2 μm and a porosity in a range from 5% to 15% is produced by method step A. 1A.

19. The method as claimed in claim 18, wherein in method step A. 1A the cathode pulse duration is in a range from 30% to 70% of the anode pulse duration.

20. The method as claimed in claim 17, wherein method step A. 1A is carried out for a period of greater than 45 minutes.

21. The method as claimed in claim 17, wherein in method step A.1A the etching current density is greater than an etching current density in method step A. 1 by at least 10%.

22. A method for preparing a germanium substrate (1) for epitaxial growth of a germanium layer (7), comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C. U; and after method step A.3, etching the processing side in a method step A.4, the processing side being alternately polarized in an anode pulse as an anode and in a cathode pulse as a cathode and an anode pulse duration is longer than a cathode pulse duration.

23. A germanium substrate structure having a germanium substrate (1) produced by a method comprising the following method steps:

A. providing a germanium substrate (1) having a processing side and a rear side opposite the processing side, and electrochemical processing at least of the processing side of the germanium substrate (1) with at least the following processing steps:

A.0 passivating the processing side, the processing side being polarized as a cathode, A.1 etching of the processing side, the processing side being alternately polarized in an anode pulse as an anode and in a cathode pulse as a cathode, A.2 electrochemical passivation of the processing side of the germanium substrate (1), the processing side being polarized as a cathode, A.3 etching of the processing side, the processing side being alternately polarized in an anode pulse as an anode and in a cathode pulse as a cathode;

B. reorganization of the processing side, the germanium substrate (1) being heated to a temperature of greater than 500° C.;

and a germanium layer (7) epitaxially applied to the germanium substrate (1), the germanium layer (7) has p-type or n-type doping with a doping concentration of greater than $10^{15}$ $cm^{-3}$, the germanium substrate (1) has at least one porous layer having a thickness in a range from 0.1 to 1.5 μm and a porosity of greater than 40% which is arranged on a processing side of the germanium substrate and has a growth layer terminating the germanium substrate (1) at the processing side and having a thickness in a range from 1 μm to 2 μm and a porosity of less than 5%, and the germanium layer (7) has an irregular, pyramid-shaped structure on a surface facing the porous layer.

* * * * *